United States Patent
Hanari

(10) Patent No.: US 9,991,284 B2
(45) Date of Patent: Jun. 5, 2018

(54) DISPLAY DEVICE

(71) Applicant: Japan Display Inc., Minato-ku (JP)

(72) Inventor: Jun Hanari, Minato-ku (JP)

(73) Assignee: Japan Display, Inc., Minato-ku (JP)

( * ) Notice: Subject to any disclaimer, the term of this patent is extended or adjusted under 35 U.S.C. 154(b) by 0 days. days.

(21) Appl. No.: 15/675,844

(22) Filed: Aug. 14, 2017

(65) Prior Publication Data

US 2018/0076221 A1 Mar. 15, 2018

(30) Foreign Application Priority Data

Sep. 12, 2016 (JP) .................................. 2016-177705

(51) Int. Cl.
| | |
|---|---|
| *H01L 27/12* | (2006.01) |
| *H01L 51/00* | (2006.01) |
| *H01L 51/52* | (2006.01) |
| *H01L 27/28* | (2006.01) |

(52) U.S. Cl.
CPC ...... *H01L 27/1203* (2013.01); *H01L 51/0024* (2013.01); *H01L 51/524* (2013.01); *H01L 27/286* (2013.01); *H01L 51/0002* (2013.01)

(58) Field of Classification Search
CPC ............ H01L 27/1203; H01L 51/0024; H01L 51/524; H01L 27/286; H01L 51/0002
See application file for complete search history.

(56) References Cited

U.S. PATENT DOCUMENTS

| | | | | |
|---|---|---|---|---|
| 9,276,055 | B1 * | 3/2016 | Son ..................... | H01L 27/3276 |
| 9,362,526 | B2 * | 6/2016 | Beom ................. | H01L 51/0024 |
| 9,865,842 | B2 * | 1/2018 | Song ................... | H01L 51/5253 |

FOREIGN PATENT DOCUMENTS

JP   2010-098645   4/2010

* cited by examiner

*Primary Examiner* — William Coleman
(74) *Attorney, Agent, or Firm* — Oblon, McClelland, Maier & Neustadt, L.L.P.

(57) ABSTRACT

Layers on a resin substrate in a peripheral area include wires extending in a wiring direction, and an inorganic insulating layer. The inorganic insulating layer is formed on first regions under the plurality of respective wires and on second regions each positioned between the adjacent first regions. The inorganic insulating layer includes a first portion on each first region. The inorganic insulating layer includes a second portion on each second region. The first portion is continuous in the wiring direction. The second portion is formed in at least either one of the manners such that the second portion is formed while avoiding a part of the second region on which the second portion is disposed or that the second portion is formed thinner than the first portion, and is continuous to the first portion adjacent to the second portion.

11 Claims, 16 Drawing Sheets

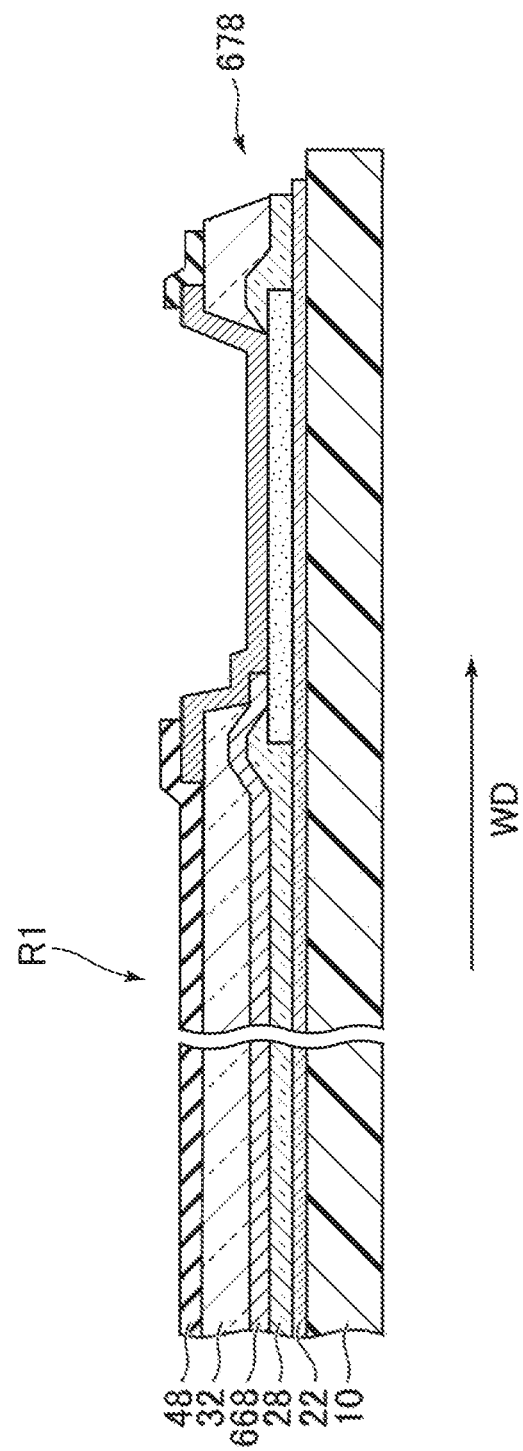

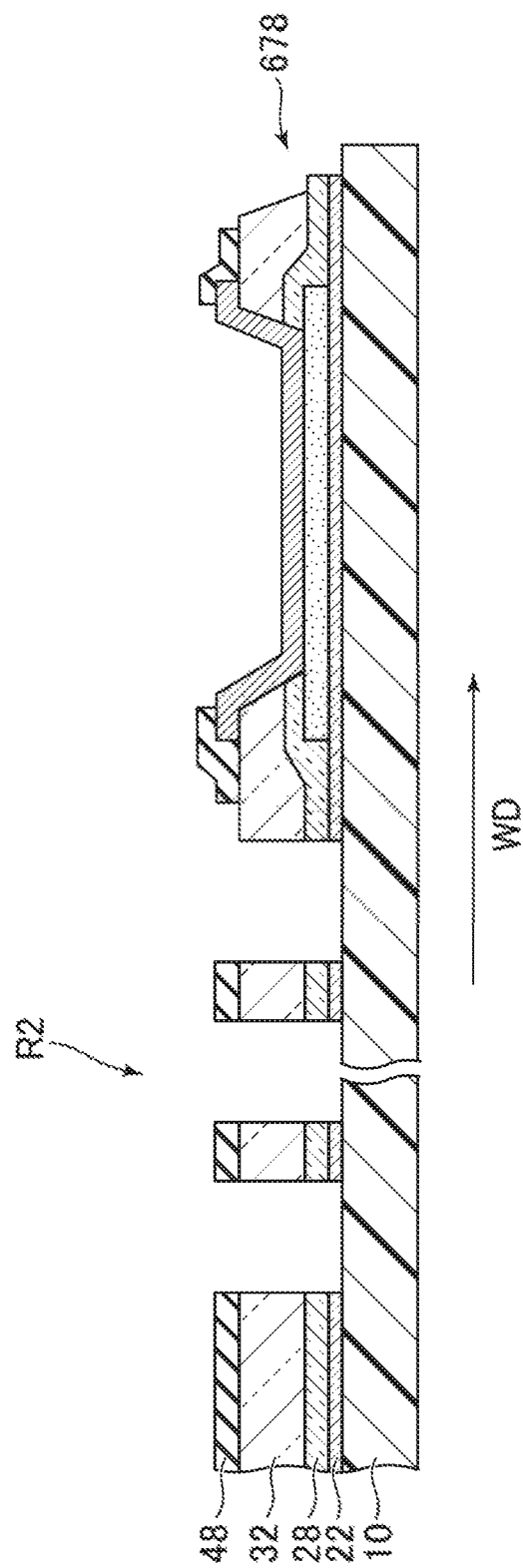

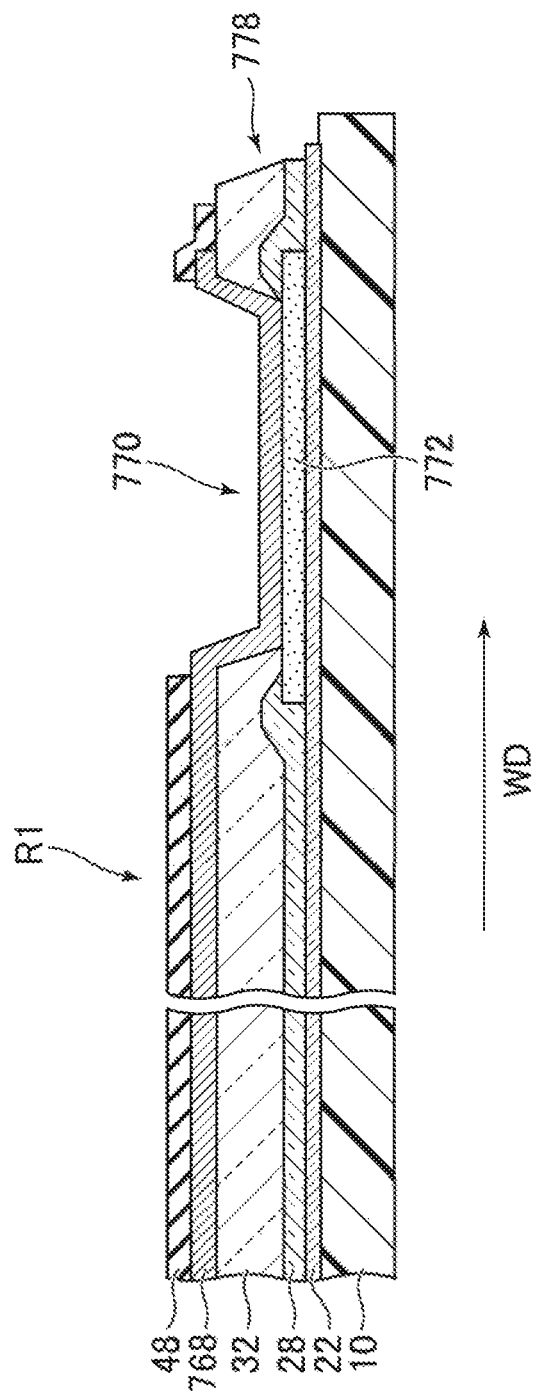

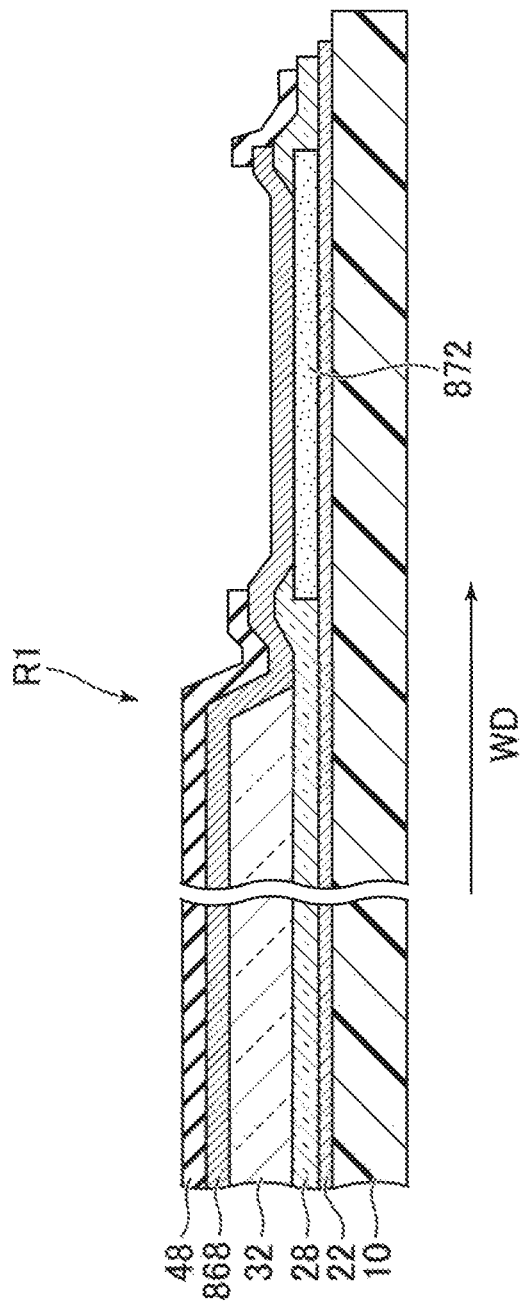

DISPLAY DEVICE

CROSS-REFERENCE TO RELATED APPLICATION

The present application claims priority from Japanese application JP2016-177705 filed on Sep. 12, 2016, the content of which is hereby incorporated by reference into this application.

BACKGROUND OF THE INVENTION

1. Field of the Invention

The present invention relates to a display device.

2. Description of the Related Art

In recent years, there has been an increasing demand for reducing the size of an area, or a frame area, (a narrow frame) around a display area for image display to thereby implement a smaller display device or a larger display area. In a frame area, wires and circuits are mounted. In particular, a demand for a narrower frame in a mobile device, such as a smart phone or the like, has become stronger. However, ideas for narrower frames seem having been all out, and it is necessary to meet the demand with other methods.

In view of the above, use of a flexible display so that a frame area is bent rearward to thereby substantially reduce the size of the frame area has been discussed. Japanese Patent Laid-open Publication No. 2010-098645 discloses a flexible display in which a circuit layer and an organic electroluminescence layer are formed on a flexible resin substrate.

In formation of a circuit layer on a resin substrate, a base film including an inorganic insulating layer made of SiN, SiO, or the like, is usually formed to prevent contamination from the resin substrate. Formation of a base film can reduce damage to the surface of the resin substrate and influence of material generated from the resin substrate upon equipment, to thereby effectively improve adhesion between a wire and the resin substrate. However, the inorganic insulating layer, which is relatively hard, can crack when the resin substrate is twisted or distorted. This raises a problem of disconnection of a wire on the substrate.

In view of the above, a method in which a base film between adjacent wires is removed while a base film directly under the wire remains is available. This structure, however, raises another problem, in the case of a wide area for many wires, of concentration of stress on particular wires when the resin substrate is twisted or distorted. This raises a problem of crack in the base film and disconnection of a wire.

SUMMARY OF THE INVENTION

It is an object of the present invention to prevent crack in an inorganic insulating layer and disconnection of a wire.

A display device according to the present invention includes a resin substrate including a display area and a peripheral area surrounding the display area; a plurality of light emitting elements disposed in the display area; a sealing layer for sealing the plurality of light emitting elements; and a plurality of layers laminated on the resin substrate in the peripheral area, wherein the plurality of layers include an electrically conductive layer including a plurality of wires extending in a wiring direction toward a plurality of terminals, and an inorganic insulating layer including at least one layer, the inorganic insulating layer is formed on a plurality of first regions overlaid with the plurality of respective wires and on a plurality of second regions each positioned between the first regions adjacent to each other, the inorganic insulating layer includes a first portion on each of the plurality of first regions, the inorganic insulating layer includes a second portion on each of the plurality of second regions, the first portion is continuous in the wiring direction, and the second portion is formed in at least either one of the manners such that the second portion is formed while avoiding a part of the second region on which the second portion is disposed or that the second portion is formed thinner than the first portion, and is continuous to the first portion adjacent to the second portion.

According to the present invention, the inorganic insulating layer formed not only on the first region but also on the second region enables dispersion of stress. This can prevent crack in the inorganic insulating layer and disconnection of the wire. Furthermore, as the second portion (a portion not vertically aligned with a wire) of the inorganic insulating layer is formed in at least either one of the manners such that the second portion is formed while avoiding a part of the second region and that the second portion is formed thinner than the first portion (a portion vertically aligned with the wire), the second portion absorbs stress, which can prevent crack in the first portion and disconnection of the wire vertically aligned with the first portion.

BRIEF DESCRIPTION OF THE DRAWINGS

FIG. 13 is a cross sectional view of a plurality of layers formed on a resin substrate in a peripheral area of a display device according to a sixth embodiment of the present invention, sectioned in a first region;

FIG. 14 is a cross sectional view of a plurality of layers formed on a resin substrate in a peripheral area of a display device according to the sixth embodiment of the present invention, sectioned in a second region;

FIG. 15 is a cross sectional view of a plurality of layers formed on a resin substrate in a peripheral area of a display device according to a seventh embodiment of the present invention, sectioned in the first region; and FIG. 16 is a cross sectional view of a plurality of layers formed on a resin substrate in a peripheral area of a display device according to an eighth embodiment of the present invention, sectioned in the first region.

DETAILED DESCRIPTION OF THE INVENTION

Figure 1:
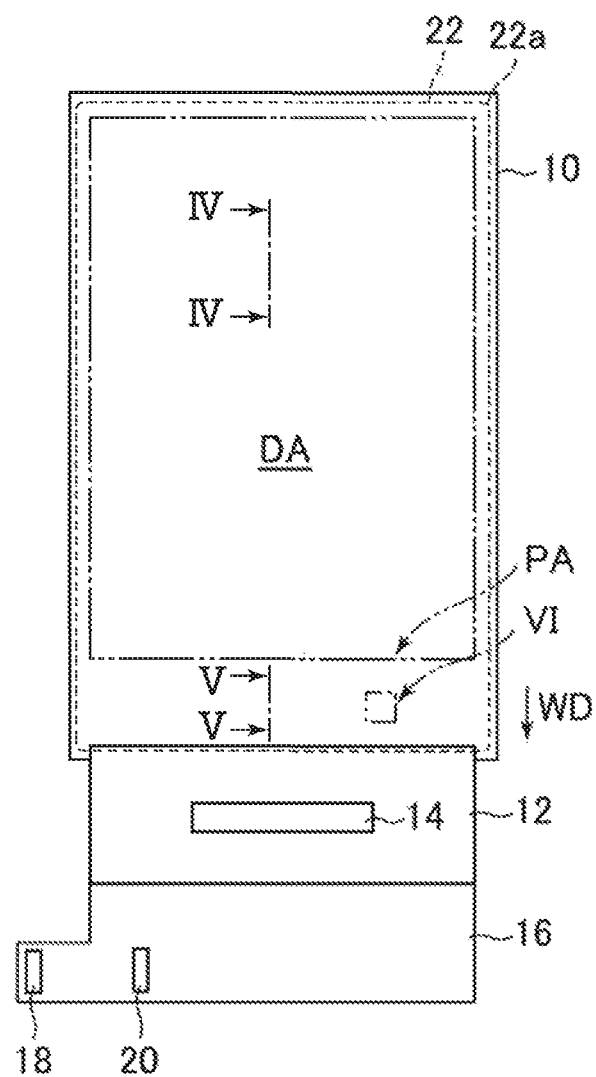
FIG. 1 is a plan view of a display device according to a first embodiment of the present invention.

The following describes embodiments of the present invention with reference to the drawings. The present invention can be rendered into practice according to various aspects in a range without departing from the gist of the present invention, and should not be interpreted as being limited to the embodiments mentioned below as examples.

The drawings may illustrate the widths, thicknesses, shapes, and so forth of the respective units more schematically for clarification of the description, as compared with those in actual aspects. Those illustrated in the drawings are mere examples, and should not limit interpretation of the present invention in any way. In the specification and the drawings, a component having a function same as one having been described in connection with a figure mentioned earlier is given the same reference numeral, and a duplicate description may be avoided.

In defining a positional relationship between one component and another component in the detailed description of the present invention, a component "on" or "under" another component refers not only to a component directly on or under another component but also a component on or under another component with still another component intervening between the one component and the other component, unless otherwise stated.

First Embodiment

Figure 2:
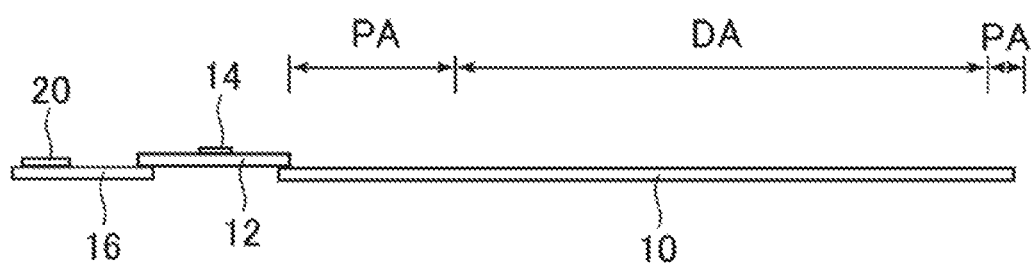
FIG. 2 is a side view of a display device according to the first embodiment of the present invention side view.

FIG. 1 is a plan view of a display device according to a first embodiment of the present invention. FIG. 2 is a side view of the display device according to the first embodiment of the present invention. An organic electro-luminescence display device as an example of a display device will be described. A display device has unit pixels (sub-pixels) for a plurality of colors including, for example, red, green, and blue, which together constitute a full-color pixel to display an image in full color. The display device has a resin substrate 10. The resin substrate 10 includes a display area DA and a peripheral area PA surrounding the display area DA. The resin substrate 10 is connected to a first flexible printed board 12 via the peripheral area PA. On the first flexible printed board 12, an integrated circuit chip 14 for driving a device for displaying an image is mounted. The first flexible printed board 12 is further connected to a second flexible printed board 16. On the second flexible printed board 16, a connector 18 for electrical communication with outside is provided, and an electronic component 20 is mounted.

Figure 3:
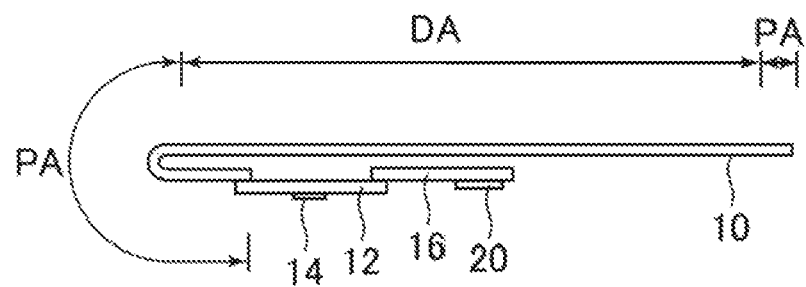
FIG. 3 explains a condition in which the display device illustrated in FIG. 2 is used.

FIG. 3 explains a condition in which the display device illustrated in FIG. 2 is used. The display device is stored in an enclosure (not shown), for example, with the resin substrate 10 thereof bending. Specifically, the display device is bent in the peripheral area PA, and remains extending in the display area DA.

Figure 4:
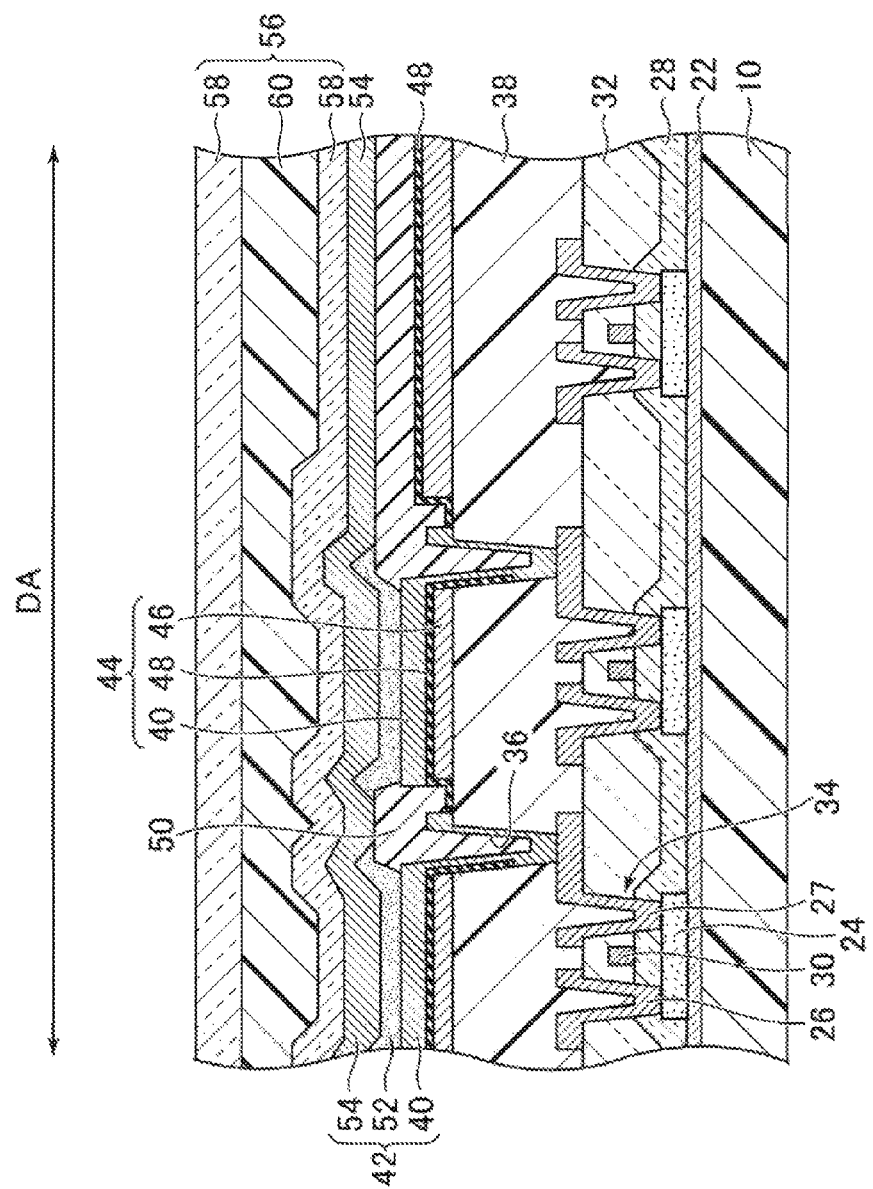
FIG. 4 is a partially omitted enlarged cross sectional view of the display device illustrated in FIG. 1 along the line IV-IV.

FIG. 4 is a partially omitted enlarged cross sectional view of the display device illustrated in FIG. 1 along the line IV-IV. The resin substrate 10 is flexible and made of polyimide resin, polyethylene terephthalate, or the like, and has a film thickness of 10 to 20 μm, for example. The resin substrate 10 has a base insulating film 22 thereon that functions as a barrier against impurities contained in the resin substrate 10. The base insulating film 22 is a silicon oxide film or a silicon nitride film, for example, or has a laminated structure including a silicon oxide film and a silicon nitride film. For the base insulating film 22 including three laminated layers including a nitride film, an oxide film, and a nitride film, the respective films have thicknesses of 20 to 50 nm, 20 to 50 nm, and 100 to 500 nm. As illustrated in FIG. 1, the base insulating film 22 has a quadrangular flat shape with four corners thereof cut off. That is, at each corner 22a of the base insulating film 22, two sides of the quadrangular shape join so as to define a curved shape, instead of an angular shape, or define an obtuse angle, if an angle should be defined. This shape prevents concentration of stress to thereby improve reliability.

A semiconductor layer 24 is formed on the bass insulating film 22. The semiconductor layer 24 is, for example, a polysilicon layer formed by annealing an amorphous silicon layer, for example, by an excimer laser, and having a film thickness of 50 nm. The semiconductor layer 24 is electrically connected to a source electrode 26 and a drain electrode 27, and covered with a gate insulating film 28. The gate insulating film 28 is formed using, for example, Tetra-EthOxySilane (TEOS), or a compound with a chemical formula $Si(OC_2H_5)_4$, and has a film thickness of 80 to 100 nm. The source electrode 26 and the drain electrode 27 each have a laminated structure including Mo, AlNd, and Mo layers or Ti, Al, and Ti layers, for example. For a laminated structure including three layers, the respective films have thicknesses of 100 to 200 nm, 300 to 600 nm, and 30 to 100 nm.

A gate electrode 30 is formed on the gate insulating film 28. The gate electrode 30 is covered with an interlayer insulating layer 32. The source electrode 26 and the drain electrode 27 penetrate the gate insulating film 28. The source electrode 26 and the drain electrode 27 are formed directly on the interlayer insulating layer 32 and penetrates the interlayer insulating layer 32 in the display area DA. The semiconductor layer 24, the source electrode 26, the drain electrode 27, the gate electrode 30, and the gate insulating film 28 together constitute a thin film transistor 34 in the display area DA. In the display area DA, the gate electrode 30 is disposed directly on the gate insulating film 28. The thin film transistor 34 is covered with a planarization layer 38. The planarization layer 38 is formed using organic material, such as polyimide resin or photosensitivity acrylic resin, so as to have a film thickness of 2 to 3 μm.

A plurality of pixel electrodes 40 (for example, positive electrodes) are formed on the planarization layer 38 so as to correspond to the plurality of respective unit pixels (sub-pixels). The pixel electrode 40 is made of MgAg, for example. Specifically, the pixel electrode 40 may be formed by laminating films of Indium Tin Oxide (ITO), of ITO, of Ag, and of ITO having respective thicknesses of 30 to 60 nm, 30 to 60 nm, 100 to 150 nm, and 10 to 20 nm so as to form a laminated structure including an electrode film and a light reflecting film. Alternatively, respective films of Indium Zinc Oxide (IZO), of IZO, of Ag, and of IZO having the above mentioned respective film thicknesses may be laminated to thereby constitute the pixel electrode 40. The pixel electrode 40 is electrically connected to one of the source electrode 26 and the drain electrode 27 on the interlayer insulating layer 32 through a contact hole 36 that penetrates the planarization layer 38.

The pixel electrode 40 constitutes apart of a light emitting element 42 to be described later, and also one electrode of a capacitor 44. The capacitor 44 includes the pixel electrode 40, a capacitance electrode 46 below the pixel electrode 40, and a dielectric insulating film 48 between the pixel electrode 40 and the capacitance electrode 46. The dielectric insulating film 48 includes laminated films including a nitride film and an oxide film or a single nitride film, and has a film thickness of 200 nm or less. The capacitance electrode 46 includes three laminated layers including Mo, AlNd, and Mo layers, or Ti, Al and Ti layers, for example, and has a film thickness of 200 nm or less. The capacitor 44 holds a signal for controlling a current to be supplied to the pixel electrode 40.

An insulating layer 50 made of polyimide resin, acrylic resin, or the like, and having a film thickness of 1 to 2 μm, for example, is formed on the pixel electrode 40. The insulating layer 50 is disposed on a peripheral portion of the pixel electrode 40 such that a part (for example, a middle portion) of the pixel electrode 40 is left open. That is, the insulating layer 50 constitutes a bank surrounding a part of the pixel electrode 40.

A light emitting layer 52 is formed on the pixel, electrode 40. Specifically, the light emitting layer 52 is formed separately (discrete) for every pixel electrode 40. The light emitting layer 52 is disposed also on the insulating layer 50. In this case, the light emitting layer 52 emits light in blue, red, or green so as to correspond to the respective pixels. Colors for the respective pixels may be any colors, such as yellow or white, besides the colors mentioned above. The light emitting layer 52 is formed through deposition, for example. Alternatively, the light emitting layer 52 may be formed covering the entire display area DA (see FIG. 1) over the plurality of pixels. That is, the light emitting layer 52 may be formed continuous on the insulating layer 50. In this case, the light emitting layer 52 is formed through coating through solvent dispersion. The light emitting layer 52 formed over the plurality of pixels emits light in white for all sub-pixels, and a part of a wavelength of a desired color is extracted through a color filter (not shown).

An opposite electrode 54 (a common electrode or a negative electrode) is formed on the light emitting layer 52. The opposite electrode 54 is disposed on the insulating layer 50 constituting a bank. The light emitting layer 52, the pixel electrode 40, and the opposite electrode 54 together constitute a light emitting element 42. The light emitting layer 52 is held between the pixel electrode 40 and the opposite electrode 54, and emits light with luminance controlled by a current flowing across the pixel electrode 40 and the opposite electrode 54. At least one of a hole transport layer and a hole injection layer (both not shown) may be formed between the light emitting layer 52 and the pixel electrode 40. At least one of an electron transport layer and an electron injection layer may be formed between the light emitting layer 52 and the opposite electrode 54. The plurality of light emitting elements 42 are formed in the display area DA, and driven by a plurality of thin film transistors 34. A capacitor 44 is formed so as to correspond to each of the plurality of light emitting elements 42.

The plurality of light emitting elements 42 are sealed by a sealing layer 56. Specifically, the light emitting element 42 is covered with the sealing layer 56 formed on the opposite electrode 54 to be thereby shut off from water. The sealing layer 56 may include at least one inorganic insulating film 58, and may have a laminated structure. The sealing layer 56 may have a structure including at least one organic insulating film 60 made of resin or the like held between a pair of inorganic insulating films 58. The pair of inorganic insulating films 58 is nitride films made of SiN or the like, each having a film thickness of 1 to 10 μm, for example. The organic insulating film 60 has a film thickness of 5 to 50 μm, for example. The sealing layer 56 covers the display area DA (see FIG. 1).

Figure 5:
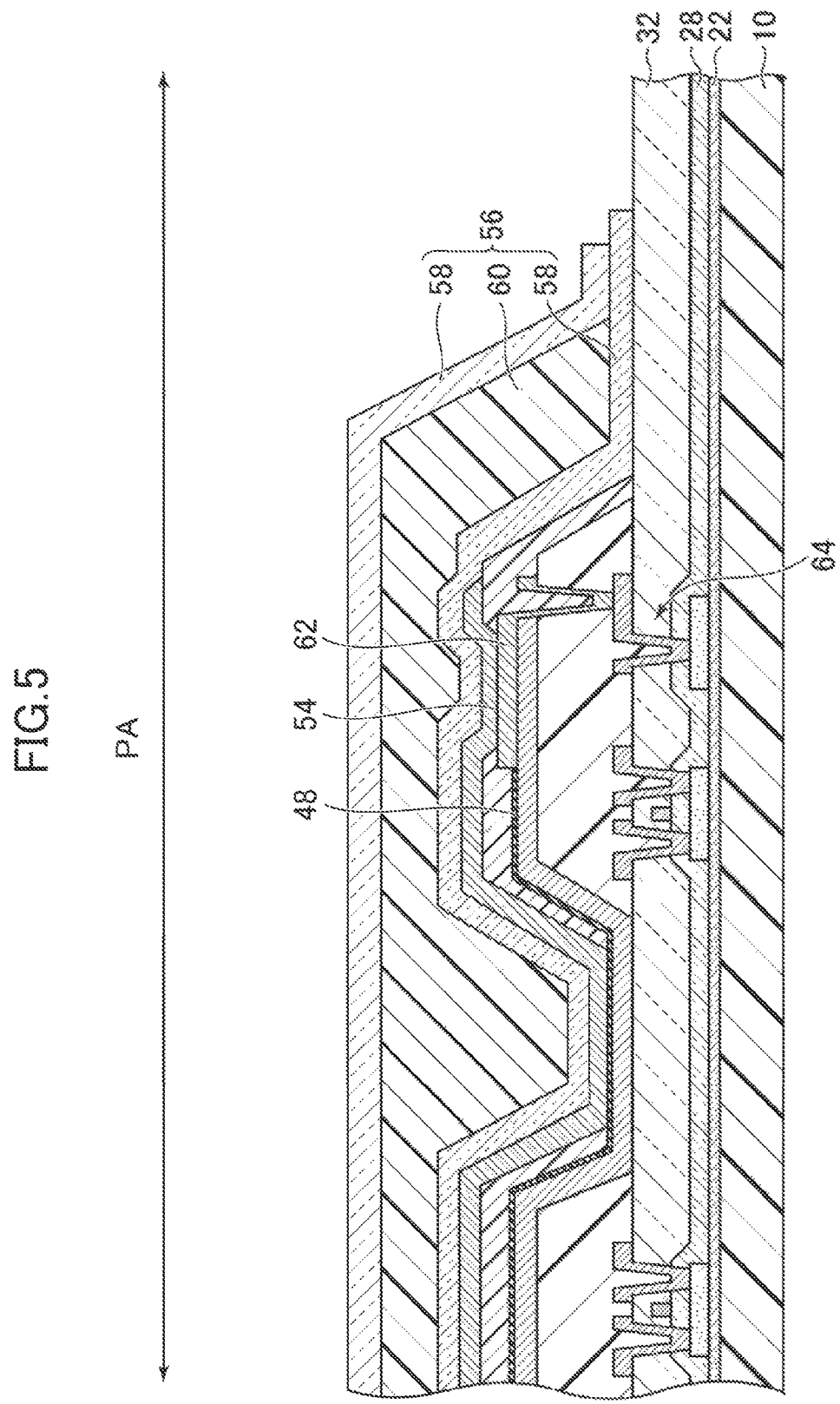
FIG. 5 is a partially omitted enlarged cross sectional view of the display device illustrated in FIG. 1 along the line V-V.

FIG. 5 is a partially omitted enlarged cross sectional view of the display device illustrated in FIG. 1 along the line V-V. In the peripheral area PA, the opposite electrode 54 is connected to a peripheral circuit 64 via a cathode contact 62. In the peripheral area PA, the pair of inorganic insulating films 58 of the sealing layer 56 sticks out from the organic insulating layer 60 held in-between to touch each other in the up-down direction around the organic insulating layer 60.

Figure 6:
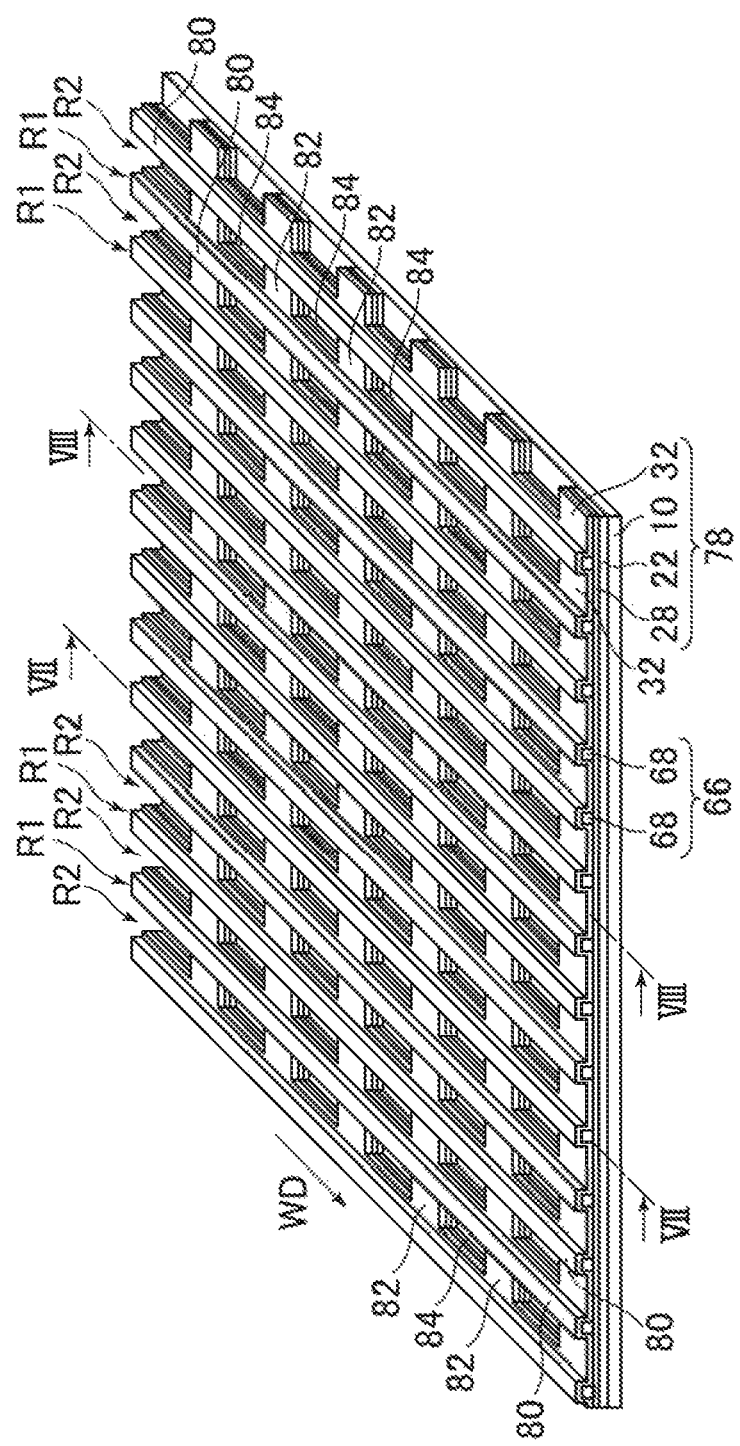
FIG. 6 is an enlarged perspective view of the portion indicated by VI in FIG. 1.

FIG. 6 is an enlarged perspective view of the portion indicated by VI in FIG. 1. In the peripheral area PA, a plurality of layers are laminated on the resin substrate 10. The plurality of layers include an electrically conductive layer 66. The electrically conductive layer 66 incudes a plurality of wires 68. The wire 68 is made of MoW or the like. For a wire 68 having a laminated structure including Ti, Al, and Ti layers, these layers respectively have film thicknesses of 100 to 200 nm, 100 to 300 nm, and 100 to 200 nm. The plurality of wires 68 include a signal line, a scan line, a power line, a ground line, or the like.

Figure 7:
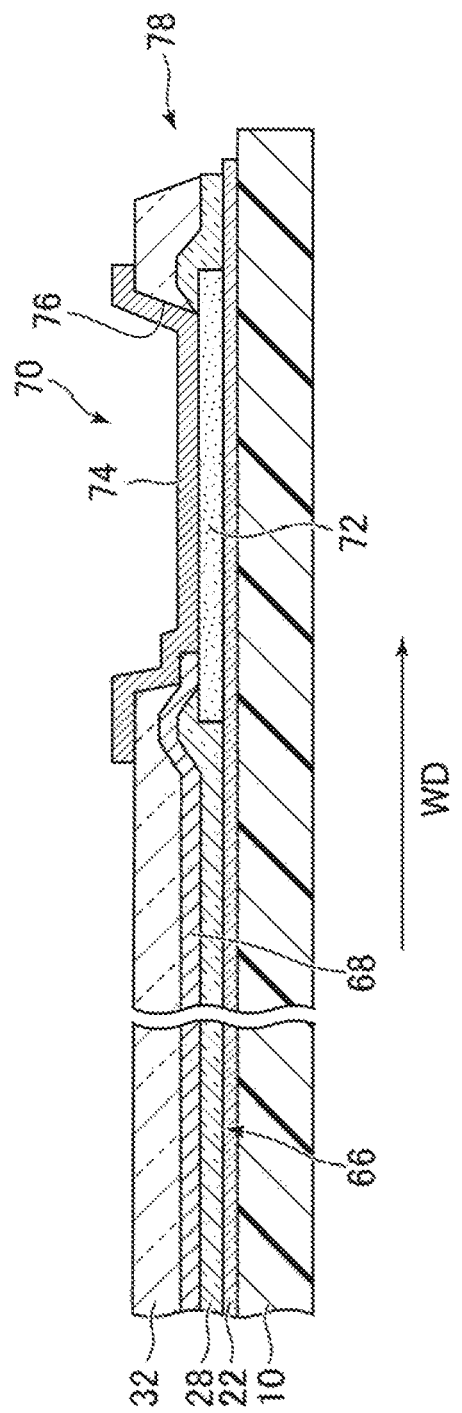
FIG. 7 is a cross sectional view of a peripheral area along the line VII-VII in FIG. 6.
Figure 8:
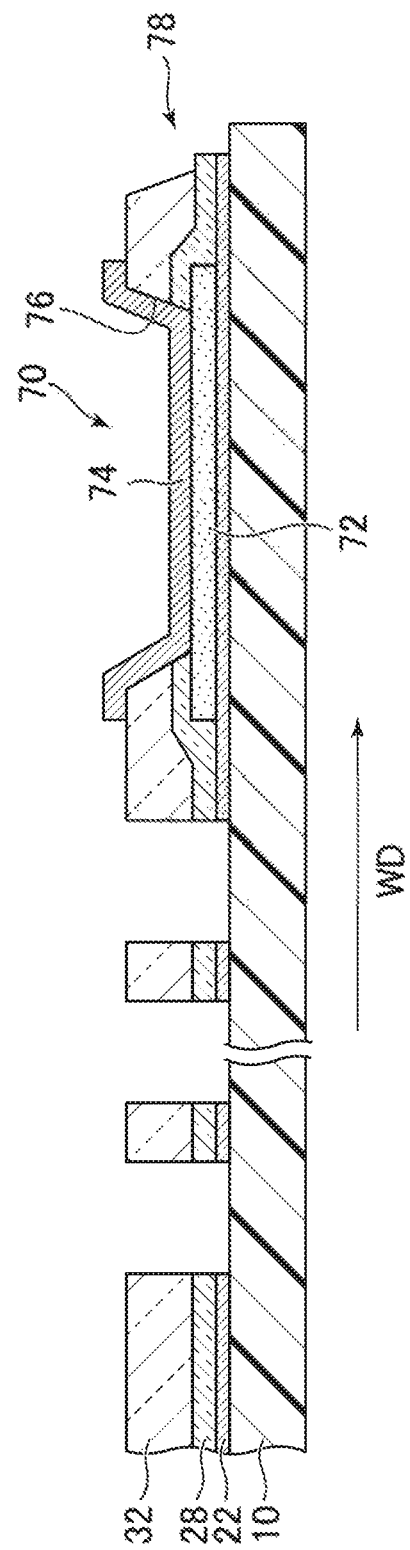
FIG. 8 is a cross sectional view of a peripheral area along the line VIII-VIII in FIG. 6.

FIG. 7 is a cross sectional view of a peripheral area along the line VII-VII in FIG. 6. FIG. 8 is a cross sectional view of a peripheral area along the line VIII-VIII in FIG. 6. The plurality of wires 68 extend toward the plurality of terminals 70 (the wiring direction WD). The plurality of terminals 70 are electrically connected to the first flexible printed board 12 illustrated in FIG. 1.

The terminal 70 includes a semiconductor film 72. The semiconductor film 72 is formed concurrently with the semiconductor layer 24 of the thin film transistor 34 illustrated in FIG. 4, using the material same as that of the semiconductor layer 24, so that the semiconductor film 72 and the semiconductor layer 24 are in the same layer. The terminal 70 includes an electrode film 74. The electrode film 74 is formed concurrently with the source electrode 26 and the drain electrode 27, using the material same as that of the source electrode 26 and the drain electrode 27, so that the electrode film 74, the source electrode 26, and the drain electrode 27 are in the same layer. The semiconductor film 72 and the electrode film 74 are laminated.

The base insulating film 22 under the semiconductor layer 24 in the display area DA illustrated in FIG. 4 extends to the peripheral area PA illustrated in FIG. 7 to lie under the semiconductor film 72. The interlayer insulating layer 32 in the display area DA extends to the peripheral area PA to lie on the semiconductor film 72, and has an opening 76 therein at least at a position corresponding to the middle area of the semiconductor film 72. An electrode film 74 is disposed in contact with the semiconductor film 72 in the opening 76 of the interlayer insulating layer 32, and disposed in contact with the interlayer insulating layer 32 in the peripheral area of the opening 76.

As shown in FIG. 6, the plurality of layers include an inorganic insulating layer 78 including at least one layer. The inorganic insulating layer 78 is formed on a plurality of first regions R1 under the respective wires 68, and has a first portion 80 disposed on each of the plurality of first regions R1. The first portion 80 continuously extends in the wiring direction WD.

An area between adjacent first regions R1 is referred to as a second region R2, and the inorganic insulating layer 78 is disposed also on a plurality of second regions R2. The inorganic insulating layer 78 has a second portion 82 disposed on each of the plurality of second regions R2. The second portion 82 is continuous to the first portion 80 adjacent thereto. The second portion 82 is formed in at least either one of the manners such that the second portion 82 is formed while avoiding a part of the second region R2 on which the second portion 82 is disposed and that the second port ion 82 is formed thinner than the first portion 80 (the former manner employed in this embodiment).

The inorganic insulating layer 78 on each of the plurality of second regions R2 has a plurality of slits 84 therein aligned in the wiring direction WD. The plurality of slits 84 divide the second portion 82 into a plurality of second sub-portions 82 aligned in the wiring direction WD. The plurality of slits 84 in each second region R2 are arranged so as to be adjacent to those in its adjacent second region R2. Similarly, the plurality of second sub-portions 82 on each second region R2 are arranged so as to be adjacent to those on its adjacent second region R2.

The gate insulating film 28 illustrated in FIG. 4 extends to the peripheral area PA to constitute at least one layer included in the inorganic insulating layer 78, as illustrated in FIG. 7. In the peripheral area PA, a plurality of wires 68 are disposed directly on the gate insulating film 28. The wire 68 is formed concurrently with the gate electrode 30, using the material same as that of the gate electrode 30, so that the wire 68 and the gate electrode 30 are in the same layer. The interlayer insulating layer 32 illustrated in FIG. 4 as well extends to the peripheral area PA to constitute at least one layer included in the inorganic insulating layer 78. That is, the inorganic insulating layer 78 is formed on the resin substrate 10 in the display area DA as well.

Alternatively, only one of the gate insulating film 28 and the interlayer insulating layer 32 may constitute at least one layer included in the inorganic insulating layer 78. An organic film (not shown) may be attached on the sealing layer 56 in a range from the display area DA to the peripheral area PA. This film may be formed on the inorganic insulating layer 78.

According to this embodiment, the inorganic insulating layer 78 formed on the second region R2 as well as on the first region R1 enables dispersion of stress, which can prevent crack in the inorganic insulating layer 78 and disconnection of the wire 68. The second portion 82 (a portion not vertically aligned with the wire 68) of the inorganic insulating layer 78 is formed in at least either one of the manners such that the second portion 82 is formed while avoiding a part of the second region R2 and that the second portion 82 is formed thinner than the first portion 80 (a portion vertically aligned with the wire 68). With the above, the second portion 82 can absorb stress so that crack in the first portion 80 and disconnection of the wire 68 vertically aligned with the first portion 80 can be prevented.

Second Embodiment

Figure 9:
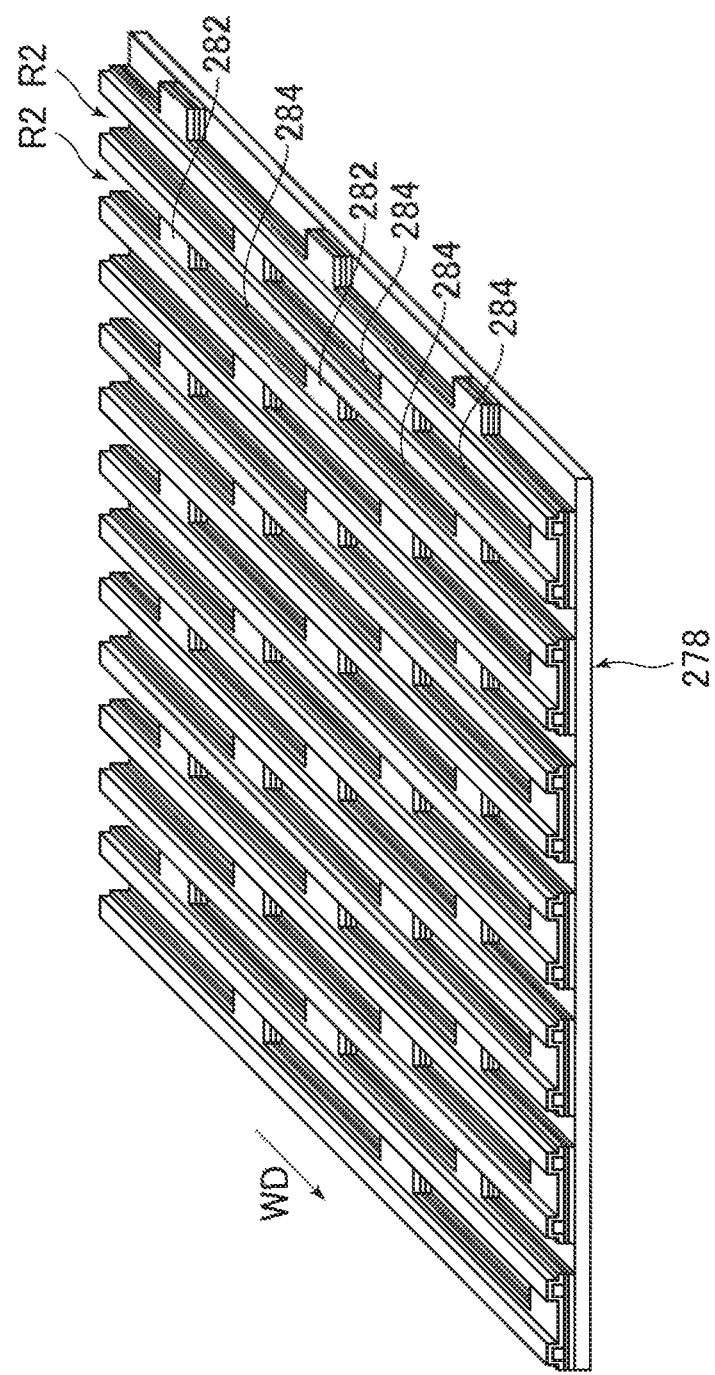
FIG. 9 is a perspective view of a part of a plurality of layers formed on a resin substrate in a peripheral area of a display device according to a second embodiment of the present invention.

FIG. 9 is a perspective view of a part of a plurality of layers formed on a resin substrate in a peripheral area of a display device according to a second embodiment of the present invention.

An inorganic insulating layer 278 has a plurality of slits 284. Some slits 284 are formed in each second region R2 so as to be aligned in the wiring direction WD. With such some slits 284, some second sub-portions 282 are resulted that are aligned so as to be spaced apart from each other in the wiring direction WD, as is described in detail in the first embodiment.

In this embodiment, the plurality of slits 284 are arranged in a staggered manner as a whole. That is, the slits 284 in one second region R2 are positioned so as not to be adjacent to those in its adjacent second region R2. This results in the plurality of second sub-portions 282 arranged in a staggered manner. That is, the second sub-portions 282 on adjacent second regions R2 are not adjacent to each other. Other contents are similar to those described in the first embodiment.

Third Embodiment

Figure 10:
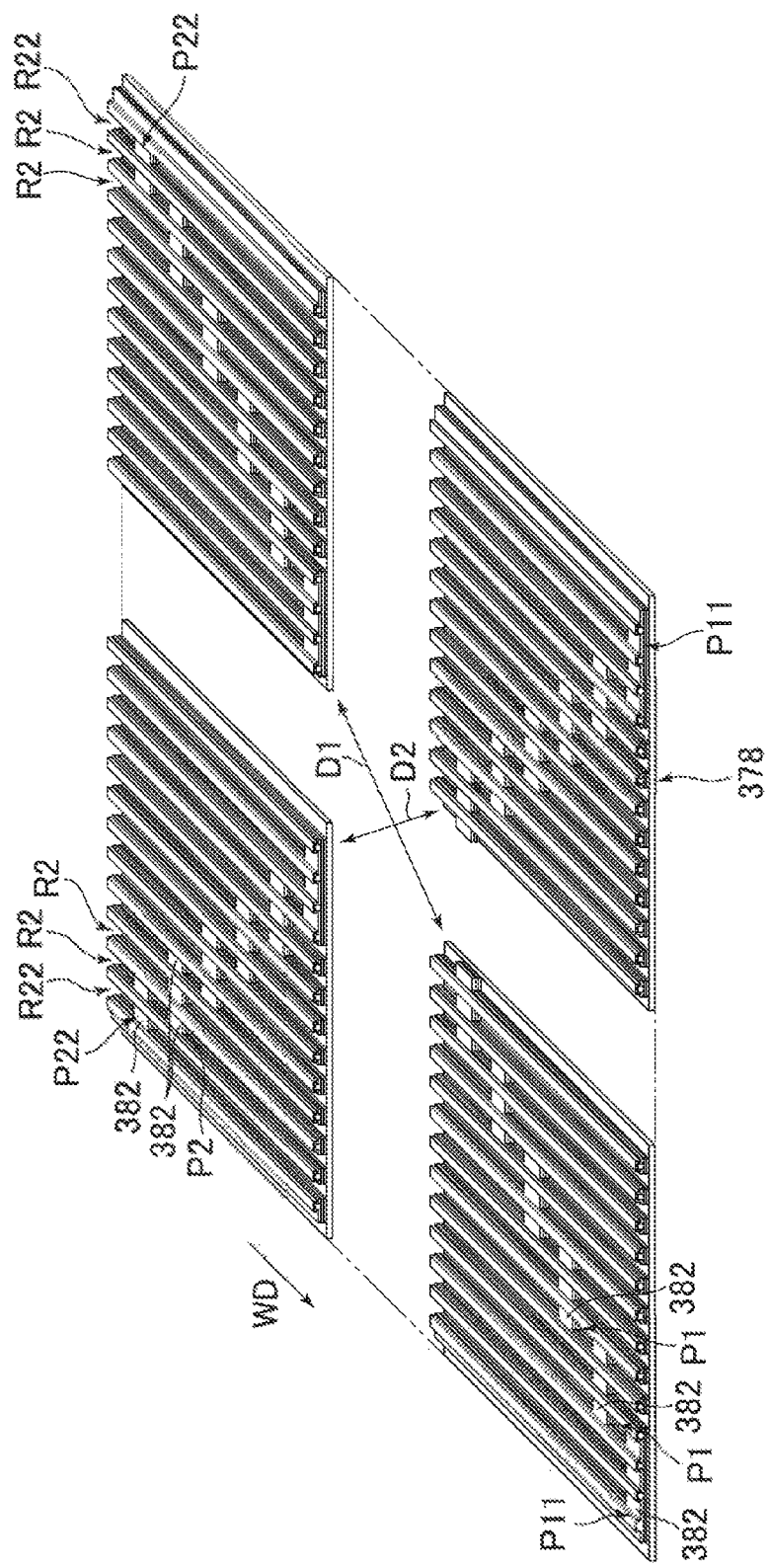
FIG. 10 is a perspective view of a part of a plurality of layers formed on a resin substrate in a peripheral area of a display device according to a third embodiment of the present invention.

FIG. 10 is a perspective view of a part of a plurality of layers formed on a resin substrate in a peripheral area of a display device according to a third embodiment, with a middle portion thereof not shown.

On each second region R2, a first position P1 and a second position P2 are defined on the respective end portions of the second region R2 along the wiring direction WD, the one end portion on the side closer to the display area DA (see FIG. 1) and the other end portion on the side farther from the display area DA, and the second portions 382 are disposed at the first position P1 and the second position P2, respectively. The first position P11 and the second position P22 on each of a pair of second regions R22 positioned farthest apart from each other are positioned farthest apart from each other. That is, the first position P11 on each of the pair of second regions R22 positioned farthest apart from each other is positioned closer to the display area DA (see FIG. 1) than the first positions P1 on any other second regions R2, while the second position P2 on the second region R22 is positioned farther from the display area DA than the second positions P2 on any other second regions R2.

For at least every single second region R2, the first position P1 and the second position P2 shift so as to get closer to each other in the direction in which the first position P1 is opposed to the second position P2. As a result of this shift, the plurality of second portions 382 are aligned along the first direction D1 and the second direction D2 that intersect with each other in letter X. This arrangement can prevent damage to the inorganic insulating layer 378 in the peripheral area PA with a fewer second portions 382.

Fourth Embodiment

Figure 11:
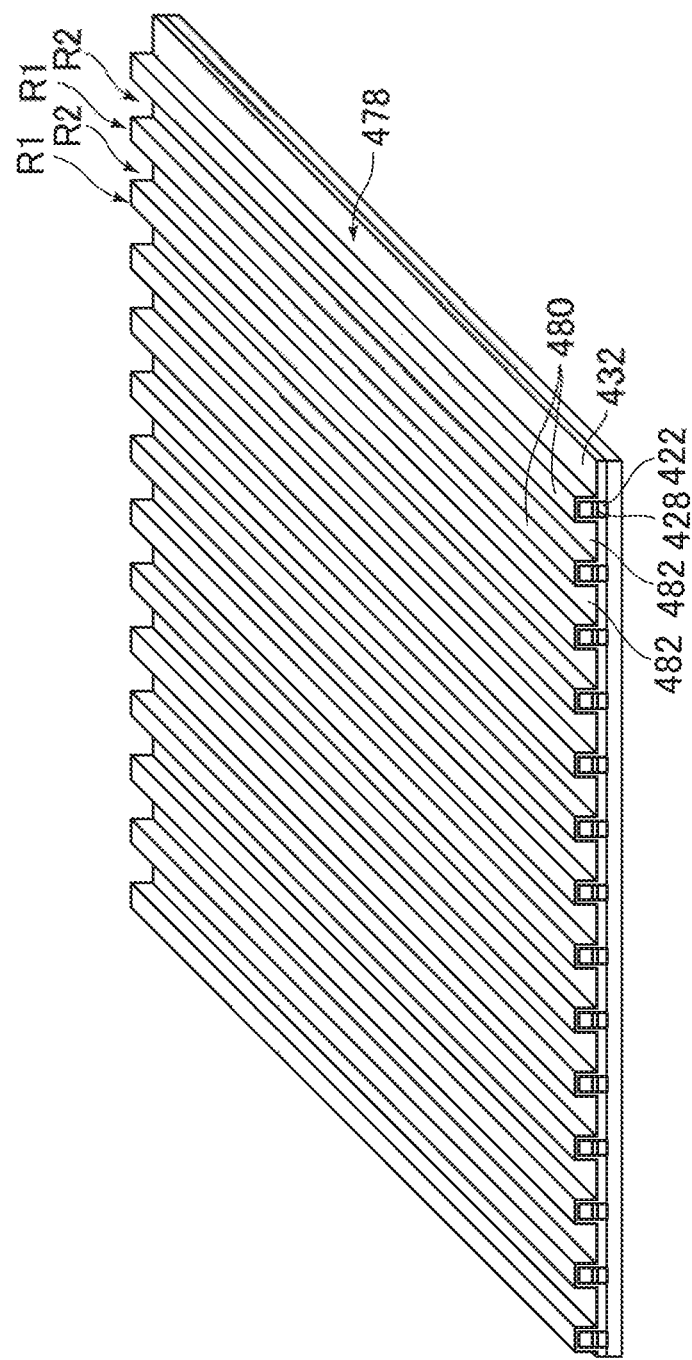
FIG. 11 is a perspective view of a part of a plurality of layers formed on a resin substrate in a peripheral area of a display device according to a fourth embodiment of the present invention.

FIG. 11 is a perspective view of a part of a plurality of layers formed on a resin substrate in a peripheral area of a display device according to a fourth embodiment of the present invention.

An inorganic insulating layer 478 includes a plurality of layers. At least one layer (for example, an interlayer insulating film 432) included in the inorganic insulating layers 478 is formed on both the plurality of first regions R1 and the plurality of second regions R2. Meanwhile, at least another layer (for example, a base insulating film 422, a gate insulating film 428) included in the inorganic insulating layers 478 is formed on the plurality of first regions R1 but not on the plurality of second regions R2. This makes the second portion 482 thinner than the first portion 480. That is, the thinner inorganic insulating layer 478 (the second portion 482) on the second region R2 produces an effect equivalent to that which is produced by a structure including the slits 84 in the inorganic insulating layer 78, as described in the first embodiment, can be obtained.

Fifth Embodiment

Figure 12:
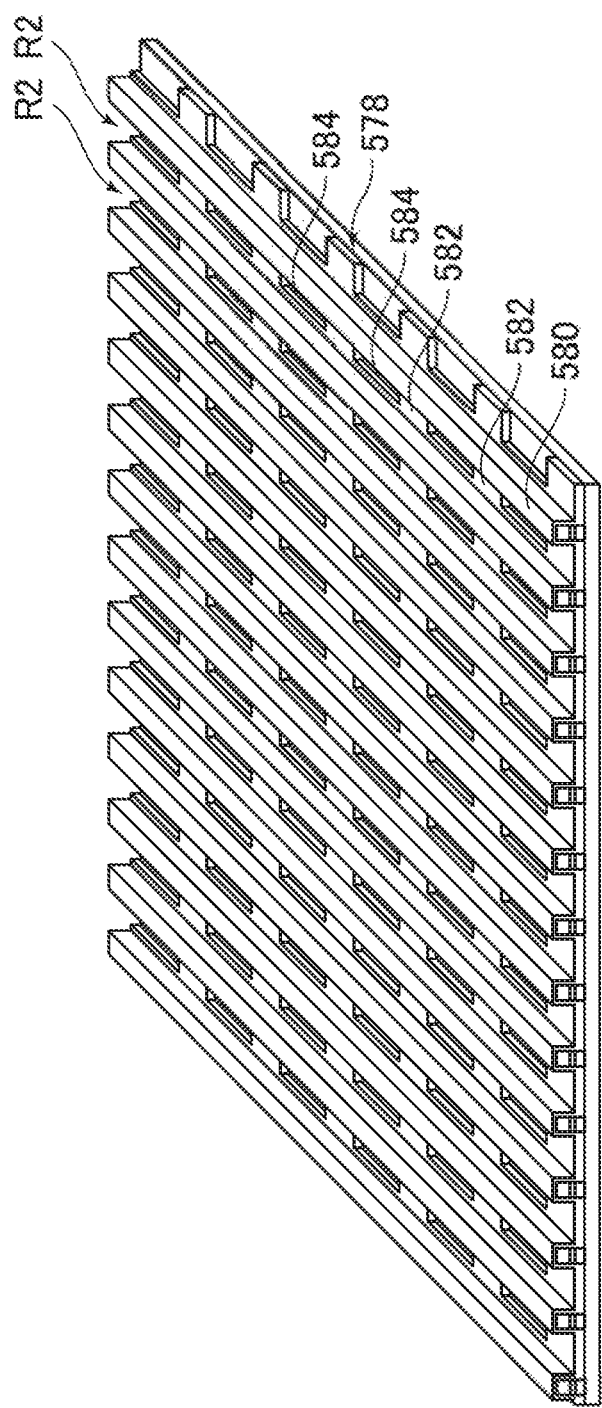
FIG. 12 is a perspective view of a part of a plurality of layers formed on a resin substrate in a peripheral area of a display device according to a fifth embodiment of the present invention.

FIG. 12 is a perspective view of a part of a plurality of layers formed on a resin substrate in a peripheral area of a display device according to a fifth embodiment of the present invention.

This embodiment is characterized in that the first embodiment is combined with the fourth embodiment. That is, the second portion 582 is thinner than the first portion 580, and the inorganic insulating layer 578 has a slit 584 in the second region R2.

Sixth Embodiment

FIG. 13 is a cross sectional view of a plurality of layers formed on a resin substrate in a peripheral area of a display device according to a sixth embodiment of the present invention, sectioned in the first region. In this embodiment, the dielectric insulating film 48 illustrated in FIG. 4 extends to the peripheral area PA to constitute one layer included in the inorganic insulating layer 678. The dielectric insulating film 48 makes the uppermost layer of the inorganic insulating layer 678. The interlayer insulating layer 32 extending from the display area DA lies under the dielectric insulating film 48, and the dielectric insulating film 48 and the interlayer insulating layer 32 both cover the wire 668. The gate insulating film 28 and the base insulating film 22 extending from the display area DA lie under the wire 668.

FIG. 14 is a cross sectional view of a plurality of layers formed on a resin substrate in a peripheral area of a display device according to the sixth embodiment of the present invention, sectioned in the second region. On the second region R2 as well, the dielectric insulating film 48 makes the uppermost layer of the inorganic insulating layer 678, and the interlayer insulating layer 32, the gate insulating film 28, and the base insulating film 22 lie under the dielectric insulating film 48.

Seventh Embodiment

FIG. 15 is a cross sectional view of a plurality of layers formed on a resin substrate in a peripheral area of a display device according to a seventh embodiment of the present invention, sectioned in the first region.

The inorganic insulating layer 778 includes the interlayer insulating layer 32 extending from the display area DA. The interlayer insulating layer 32 overlaps an end portion of the semiconductor film 772. The gate insulating film 28 as well overlaps the end portion of the semiconductor film 772. That is, the gate insulating film 28 and the interlayer insulating layer 32 are present between the end portion of the semiconductor film 772 and the wire 768. The interlayer insulating layer 32 is formed also in a position closer to the tip end of the resin substrate 10 than the semiconductor film 772 is.

In the peripheral area PA, a plurality of wires 768 are disposed directly on the interlayer insulating layer 32. The plurality of wires 768 are formed concurrently with the source electrode 26 and the drain electrode 27 illustrated in FIG. 4, using the material same as that of the source electrode 26 and the drain electrode 27. The dielectric insulating film 48 extends to the peripheral area PA to cover the plurality of wires 768 except in a plurality of terminals 770. The dielectric insulating film 48 is one layer (the uppermost layer) included in the inorganic insulating layer 778.

Eighth Embodiment

FIG. 16 is a cross sectional view of a plurality of layers formed on at resin substrate in a peripheral area of a display device according to an eighth embodiment of the present invention, sectioned in the first region.

This embodiment differs from the seventh embodiment in shape of the interlayer insulating layer 32. The interlayer insulating layer 32 does not overlap an end portion of the semiconductor film 872, so that the wire 868 overlaps, while contacting, the gate insulating film 28 in a position where the wire 868 is disposed adjacent to an end portion of the semiconductor film 872. The interlayer insulating layer 32 is not formed in a position closer to the tip end of the resin substrate 10 than the semiconductor film 872 is.

The display device may be any display device without particular limitation, besides an organic electro-luminescence display device, and may be a display device having a light emitting element, such as a quantum-dot light emitting diode (QLED), in each pixel or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
  a resin substrate including a display area and a peripheral area surrounding the display area;
  a plurality of light emitting elements disposed in the display area;
  a sealing layer for sealing the plurality of light emitting elements; and
  a plurality of layers laminated on the resin substrate in the peripheral area,
  wherein
  the plurality of layers include an electrically conductive layer including a plurality of wires extending in a wiring direction toward a plurality of terminals, and an inorganic insulating layer including at least one layer,
  the inorganic insulating layer is formed on a plurality of first regions under the plurality of respective wires and on a plurality of second regions each positioned between the first regions adjacent to each other,
  the inorganic insulating layer includes a first portion on each of the plurality of first regions,
  the inorganic insulating layer includes a second portion on each of the plurality of second regions,
  the first portion is continuous in the wiring direction, and
  the second port ion is formed in at least either one of manners such that the second portion is formed while avoiding a part of the second region on which the second portion is disposed or that the second portion is formed thinner than the first portion, and is continuous to the first portion adjacent to the second portion.
2. The display device according to claim 1, wherein
  the inorganic insulating layer has a plurality of slits aligned in the wiring direction in each of the plurality of second regions, the plurality of slits divide the second portion into a plurality of second sub-portions aligned in the wiring direction, and the plurality of slits in each of the plurality of second regions are arranged so as to be adjacent to a plurality of respective slits formed in a second region adjacent to the second region.

3. The display device according to claim 1, wherein the inorganic insulating layer has a plurality of slits formed such that some slits are aligned in the wiring direction on each of the plurality of second regions, the some slits divide the second portion into a plurality of second sub-portions aligned in the wiring direction, and the plurality of slits are arranged in a staggered manner.

4. The display device according to claim 1, wherein the second portion is disposed on each of a pair of positions defined on each of the plurality of second regions, the positions including one position on a side closer to the display area and another position on a side farther from the display area, on each of a pair of second regions positioned farthest apart from each other, the one position and the other position are positioned farthest apart from each other, the one position being closest to the display area and the other position being farthest from the display area, and each of the one position and the other position shifts for at least every single second region so as to get closer to each other in a direction in which the one position is opposed to the other position.

5. The display device according to claim 1, wherein the second portion is thinner than the first portion, the inorganic insulating layer includes a plurality of inorganic insulating layers, at least one layer included in the inorganic insulating layer is formed on the plurality of first regions and the plurality of second regions, and at least another layer included in the inorganic insulating layer is formed on the plurality of first regions, while avoiding the plurality of second regions.

6. The display device according to claim 1, wherein the inorganic insulating layer is formed on the resin substrate in the display area.

7. The display device according to claim 1, further comprising a capacitor corresponding to each of the plurality of light emitting elements, wherein the capacitor includes a pixel electrode, a capacitance electrode, and a dielectric insulating film between the pixel electrode and the capacitance electrode, and the dielectric insulating film extends to the peripheral area to constitute the one layer included in the inorganic insulating layer.

8. The display device according to claim 6, further comprising:

a thin film transistor formed in the display area, for driving each of the plurality of light emitting elements, wherein at least one of a gate insulating film of the thin film transistor and an interlayer insulating film covering the thin film transistor extends to the peripheral area to constitute the at least one layer included in the inorganic insulating layer.

9. The display device according to claim 8, wherein the inorganic insulating layer includes the gate insulating film, the thin film transistor has a gate electrode formed directly on the gate insulating film in the display area, and the plurality of wires are disposed directly on the gate insulating film in the peripheral area.

10. The display device according to claim 8, wherein the inorganic insulating layer includes the interlayer insulating film, the thin film transistor has a source electrode and a drain electrode formed directly on the interlayer insulating layer in the display area and penetrating the interlayer insulating layer, and the plurality of wires are disposed directly on the interlayer insulating layer in the peripheral area.

11. The display device according to claim 7, wherein the dielectric insulating film is an uppermost layer of the inorganic insulating layer.

* * * * *